United States Patent
Kawakatsu

(10) Patent No.: US 9,038,331 B2
(45) Date of Patent: May 26, 2015

(54) MOUNT SUPPORT STRUCTURE FOR SOLAR CELL MODULE

(71) Applicant: XSOL CO., LTD., Kyoto-shi, Kyoto (JP)

(72) Inventor: Kazushi Kawakatsu, Kyoto (JP)

(73) Assignee: XSOL Co., Ltd., Kyoto (JP)

( * ) Notice: Subject to any disclaimer, the term of this patent is extended or adjusted under 35 U.S.C. 154(b) by 0 days.

(21) Appl. No.: 14/292,564

(22) Filed: May 30, 2014

(65) Prior Publication Data

US 2014/0261641 A1 Sep. 18, 2014

Related U.S. Application Data

(63) Continuation of application No. PCT/JP2012/080920, filed on Nov. 29, 2012.

(30) Foreign Application Priority Data

Dec. 2, 2011 (JP) ................. 2011-264215

(51) Int. Cl.
*H01L 31/042* (2014.01)
*H02S 20/24* (2014.01)
(Continued)

(52) U.S. Cl.
CPC ............ *H01L 31/0422* (2013.01); *Y02E 10/50* (2013.01); *Y02B 10/12* (2013.01); *H02S 20/00* (2013.01); *H02S 20/24* (2014.12); *H01L 31/02008* (2013.01); *H02S 40/36* (2014.12)

(58) Field of Classification Search
CPC ...................... H01L 31/0422; H01L 31/02008
USPC ....................................... 52/173.3
See application file for complete search history.

(56) References Cited

U.S. PATENT DOCUMENTS 4,269,173 A * 5/1981 Krueger et al. ............... 126/634
5,125,608 A * 6/1992 McMaster et al. ......... 248/163.1
(Continued)

FOREIGN PATENT DOCUMENTS

JP 2007-35849 A 2/2007
JP 2009-523204 A 6/2009

OTHER PUBLICATIONS

International Search Report in corresponding PCT application PCT/JP2012/080920 dated Feb. 19, 2013, 2 pp. in English and 2 pp. in Japanese.

(Continued)

*Primary Examiner* — Mark Wendell
*Assistant Examiner* — Keith Minter
(74) *Attorney, Agent, or Firm* — Juan Carlos A. Marquez; Bacon & Thomas PLLC

(57) ABSTRACT

Disclosed is a mount support structure for readily supporting and fixing a solar cell module to a mount. A module side connector is arranged downside of a lower face of the solar cell module in two places and a hook fixture is arranged upside of a lower face of a flexible frame, a mount side connector is arranged in two places of lengthwise end and intermediate portion of module support frame located below of a parallel pair arranged on a slanted face of the mount, a hook receiving hole is arranged on a back face of the module support frame, and pressing downward the solar cell module, with the hook fixture rotatively latched in the hook receiving hole, allows for output connection and mount fixture by coupling the module side and the mount side connectors, subsequently for fixing the solar cell module to the mount.

10 Claims, 6 Drawing Sheets

(51) Int. Cl.
*H01L 31/02* (2006.01)
*H02S 40/36* (2014.01)

(56) References Cited

U.S. PATENT DOCUMENTS

| | | | | |
|---|---|---|---|---|
| 6,465,724 | B1* | 10/2002 | Garvison et al. | 136/244 |
| 7,748,175 | B2* | 7/2010 | Liebendorfer | 52/173.3 |
| 7,866,099 | B2* | 1/2011 | Komamine et al. | 52/173.3 |
| 8,256,169 | B2* | 9/2012 | Cusson et al. | 52/173.3 |
| 8,661,747 | B2* | 3/2014 | Eide | 52/173.3 |
| 8,695,291 | B2* | 4/2014 | Pisklak et al. | 52/173.3 |
| 2005/0034754 | A1* | 2/2005 | Schmidt | 136/256 |
| 2009/0025314 | A1* | 1/2009 | Komamine et al. | 52/173.3 |
| 2010/0077679 | A1* | 4/2010 | Sagayama | 52/173.3 |
| 2010/0325976 | A1* | 12/2010 | Degenfelder et al. | 52/173.3 |
| 2010/0326498 | A1* | 12/2010 | Corneille et al. | 136/251 |
| 2011/0017278 | A1* | 1/2011 | Kalkanoglu et al. | 136/251 |
| 2011/0146763 | A1* | 6/2011 | Sagayama | 136/251 |
| 2011/0214367 | A1* | 9/2011 | Haddock et al. | 52/173.3 |
| 2011/0220180 | A1* | 9/2011 | Cinnamon et al. | 136/251 |
| 2014/0014165 | A1* | 1/2014 | Echizenya et al. | 136/251 |
| 2014/0096462 | A1* | 4/2014 | Haddock | 52/173.3 |

OTHER PUBLICATIONS

Office Action from Japanese Patent Office in the corresponding Japanese application 2011-264215 dated Jan. 27, 2015, 2 pages in Japanese with 3 pages of English translation.

"Design and Work for Solar Power System ($3^{rd}$ revision)," (Photovoltaic Power Generating System) issued on Dec. 5, 2010, Ohm Co.), 247 pp. in Japanese, with 3 pp. of summary in English.

* cited by examiner

MOUNT SUPPORT STRUCTURE FOR SOLAR CELL MODULE

CLAIM TO PRIORITY

This is a bypass continuation of PCT Application PCT/JP2012/080920 filed on Nov. 29, 2012, which claims the priority date of Japanese Application No. 2011-264215 filed on Dec. 2, 2011, both of which are hereby incorporated by reference.

TECHNICAL FIELD

This invention relates to solar cell modules, in particular to mount support structures thereof.

BACKGROUND ART

A roof integrated solar cell module is, for example, configured to fill between a front cover and a back cover, a solar cell, an inter connector and a filler, and to place a terminal box behind the back cover, wherein the front cover is made of such toughened glass, transparent synthetic resin, or laminated film for example, the back cover is made of steal plate, or laminated film, and a cable led from the terminal box is further connected to an external cable and is wired to a power conditioner. At this time, generally, roofing the solar cell module onto a roof face is made in such a fashion that onto a roofboard fixed to a roof structure material to cover the roof is placed a frame bar, the solar cell module is then placed, and is fixed to the roof by using a rectangular metal plate (choshi) with such screw or nail, and thereby is performed on the spot.

CITATION LIST

Non Patent Literature

NPTL 1: "Design and Work for Solar Power System (3rd revision)" (issued on Dec. 5, 2010, Ohm Co.)

SUMMARY OF INVENTION

Technical Problem

Concerning installing such solar cell module, the inventor has already advocated that installing work of the solar cell module is facilitated and secured as much as possible by omitting generally-required installment of a terminal box to behind the solar cell module and wiring work of a cable connection. This can be mode in such a fashion that a module side connector arranged on a lower face of the solar cell module, a roof face or wall face side connector arranged on a roof face or a roof wall on which the solar cell module is to be set are provided, and connection of these connectors by pressing downwardly with a single operation allows an output of the solar cell module to be connected and the solar cell module to be fixed to the roof face or the roof wall. At this time, the solar cell module is, for example, provided with an overlap space thereabove, the module side connector is arranged on the overlap space, a rack rail including a step receiving the overlap space on the roof face or the roof wall, the roof face or roof wall side connector on the step, and the solar cell module is fixed by connection of the connectors, for example, by mutual latch of a snap-in latch part of the connector.

In this case, although it is possible to install the solar cell module readily and securely as much as possible as mentioned above, the solar cell module is, for example, often installed on a slanted site as is the case of on the ground or deck roof, and in this case it is also required to wire a terminal box behind the solar cell module and a cable. It is therefor required that the solar cell module is installed using the mount, so as to both connect an output of the solar cell module and be fixed to the mount with such a single operation.

The invention is made in view of the foregoing problems, and thus an object thereof is to provide a mount support structure for the solar cell module allowing the solar cell module to be fixed to a mount readily and securely as much as possible.

Solution to Problem

The invention is made in light of the foregoing problems in such a fashion that a module side connector is arranged on a lower face of a solar cell module, amount side connector on an upper face of a mount, these connectors are pressed vertically and coupled with each other so as to coinstantaneously connect an output of the solar cell module and fix to the mount. Namely, there is provided a mount support structure for solar cell module, including a module side connector arranged on a lower face of the solar cell module; a mount side connector arranged on an upper face of the mount supporting the solar cell module, wherein the module side connector and the mount side connector are configured to coinstantaneously allow an output of the solar cell module to be connected and the solar cell module to be fixed to the mount.

Preferably, in addition to the above, the solar cell module is supported relative to the mount using a pair of parallel module support frames, and it is achieved to install the solar cell module stably and securely using one of the pair of module support frames for coupling connector, the other for fixing the solar cell module by fixture. This is made in such a fashion that for every solar cell module disposed on the mount, one of the pair of module support frames has the mount side connector arranged thereat, the other of the pair of module support frames has a fixture arranged at the solar cell module or a surrounding flexible frame arranged at the solar cell module arranged thereat.

Preferably, in addition to the above, connection and fixture to the pair of parallel module support frames in total four places of each two places at ends of solar cell module allows the solar cell module to be strongly, stably and securely installed. This is made such that the module side connector and the mount side connector are arranged in two places of vertical ends or lateral ends of the solar cell module, and in two places of the one of the pair of module support frames in a length direction, and the fixture is fixed to the solar cell module or the surrounding flexible frame arranged at the solar cell module in two places of vertical ends or lateral ends of the solar cell module, and in two places of the other of the pair of module support frames in the length direction, thereby fixing of the solar cell module in four places to the mount.

Preferably, in addition to the above, the connectors of the solar cell module are connected by pressing downwardly relative to the mount at the mount located below, below the fixture in the mount located above, so as to install readily as much as possible to the mount. This is made such that the pair of module support frames is arranged vertically in a slanted direction of the mount, and the module support frame located above is adapted for the fixture, the module support frame located below for the connector.

Preferably, in addition to the above, the solar module is fixed using the fixture such as to rotatively latch to the module support frame, and the connectors are connected by pressing downwardly under rotatively latching condition, further facilitating installing work to the mount. This is made such that the solar cell module is fixed such that a hook fixture arranged at the solar cell module is rotatively latched to a hook hole arranged at the module support frame.

Preferably, in addition to the above, protection of the solar cell module and the connector of the mount, and connection are achieved readily and securely as much as possible. This is made such that the module side connector is, with a coupling part projecting downwardly, arranged at a connector box arranged on the lower face of the solar cell module, the mount side connector is, with the coupling part thereof projecting upwardly, arranged at a connector box or a connector base arranged on an upper face of module support frame.

Preferably, in addition to the above, coupling of the connectors is achieved in a complete manner by pressing downwardly. This is made such that fixing the solar cell module to the mount by coupling the connectors is performed by latching the connectors to each other, or the snap-in latch part between the connector and the solar cell module or the flexible frame arranged at the solar cell module.

The invention is, as outlined in those above, made for resolving the above problems.

Advantageous Effects of Invention

According to the foregoing structures, since the module side connector is arranged on the lower face of the solar cell module; the mount side connector is arranged on an upper face of the mount supporting the solar cell module, wherein the module side connector and the mount side connector are configured to coinstantaneously allow an output of the solar cell module to be connected and the solar cell module to be fixed to the mount, it is made possible to provide the mount support structure for the solar cell module configured to install the solar cell module readily and securely as much as possible.

Since in the invention, in addition to the above, the solar cell module is supported relative to the mount using the pair of parallel module support frames, the one of which is for coupling the foregoing connectors, the other of which for fixing the fixture, it is made possible to stably and securely install the solar cell module.

Since in the invention, in addition to the above, coupling the connectors and fixing the fixture with respect to the pair of parallel module support frames are made in total four places of each two places at the ends of solar cell module, it is made possible to secure installment strength of the solar cell module, and further to stably and securely install the solar cell module.

Since in the invention, in addition to the above, the connectors of the solar cell module are connected by pressing downwardly relative to the mount at the mount located below, below the fixture in the mount located above, it is made possible to facilitate installing work to the mount as much as possible.

Since in the invention, in addition to the above, the solar module is fixed using the fixture such as to rotatively latch to the module support frame, and the connectors are connected by pressing downwardly under rotatively latching condition, it is made possible to further facilitate installing work to the mount.

Since in the invention, in addition to the above, it is made achieved to protect the solar cell module and the connector of the mount, and to couple the connection readily and securely as much as possible.

Since in the invention, in addition to the above, it is made achieved in a complete manner to couple the connectors by pressing downwardly.

DESCRIPTION OF EMBODIMENTS

Figure 1:
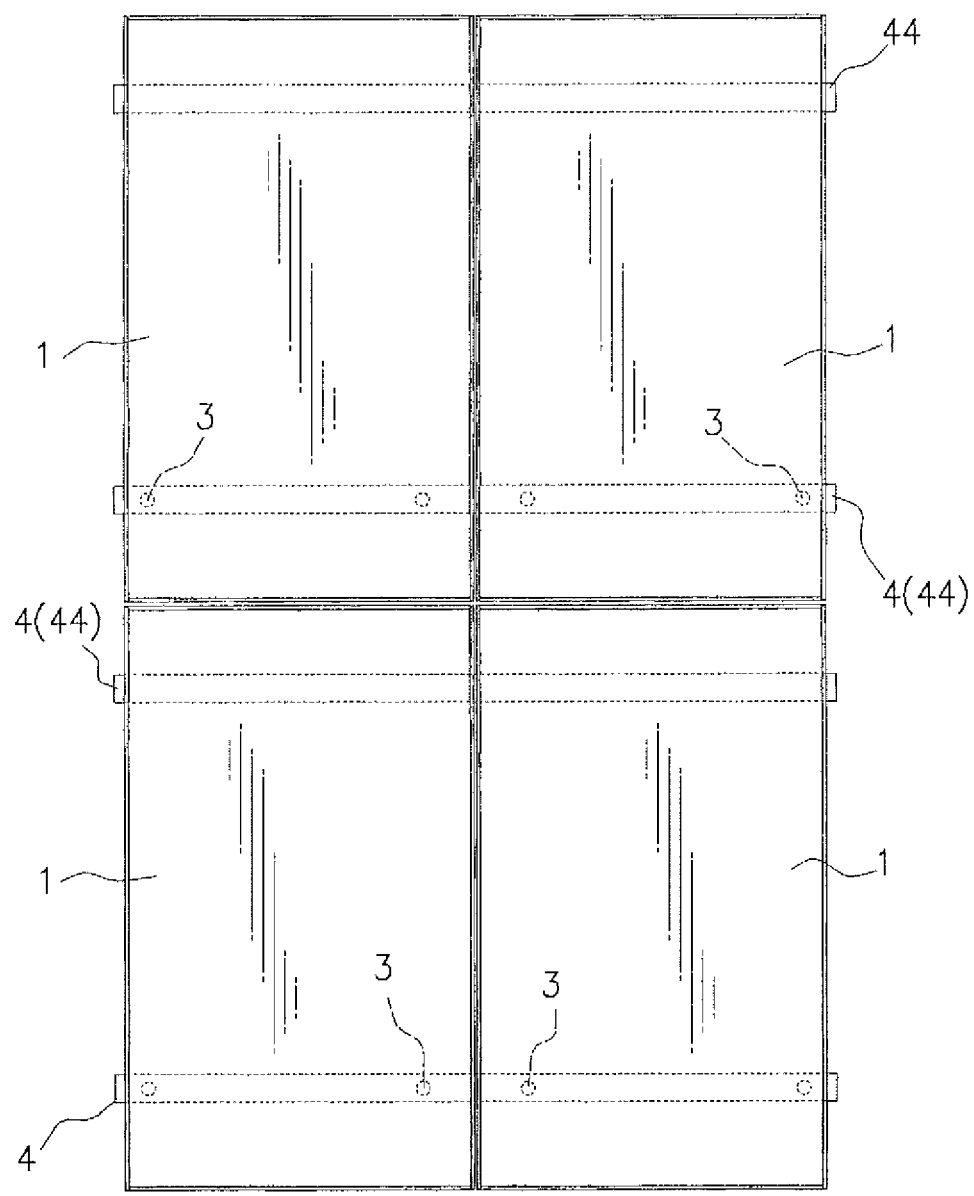
FIG. 1 is a plane view illustrating a state of amount arrangement of a solar cell module.
Figure 2:
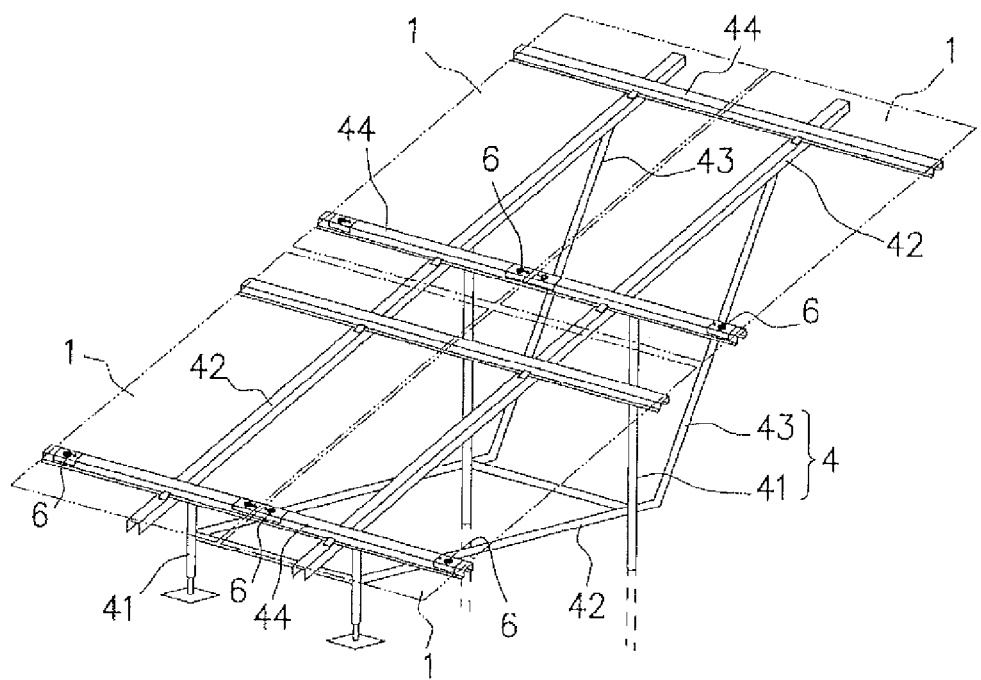
FIG. 2 is a perspective view illustrating relationship between the mount and the solar cell module.
Figure 3:
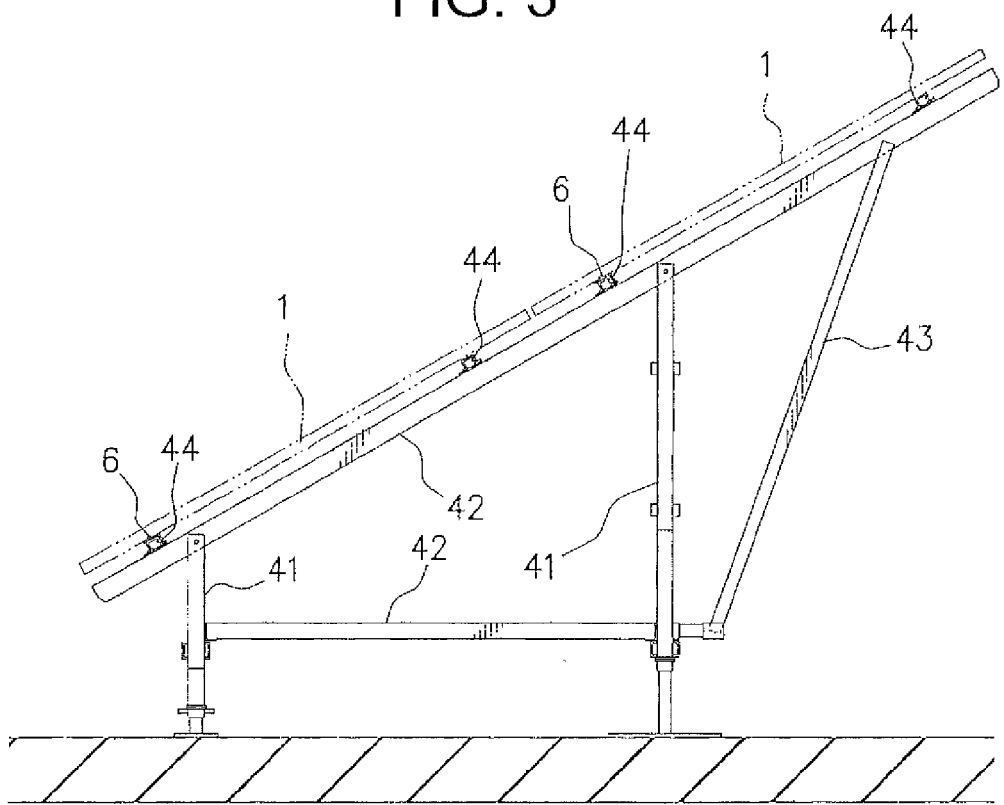
FIG. 3 is a side view illustrating relationship between the mount and the solar cell module.
Figure 4:
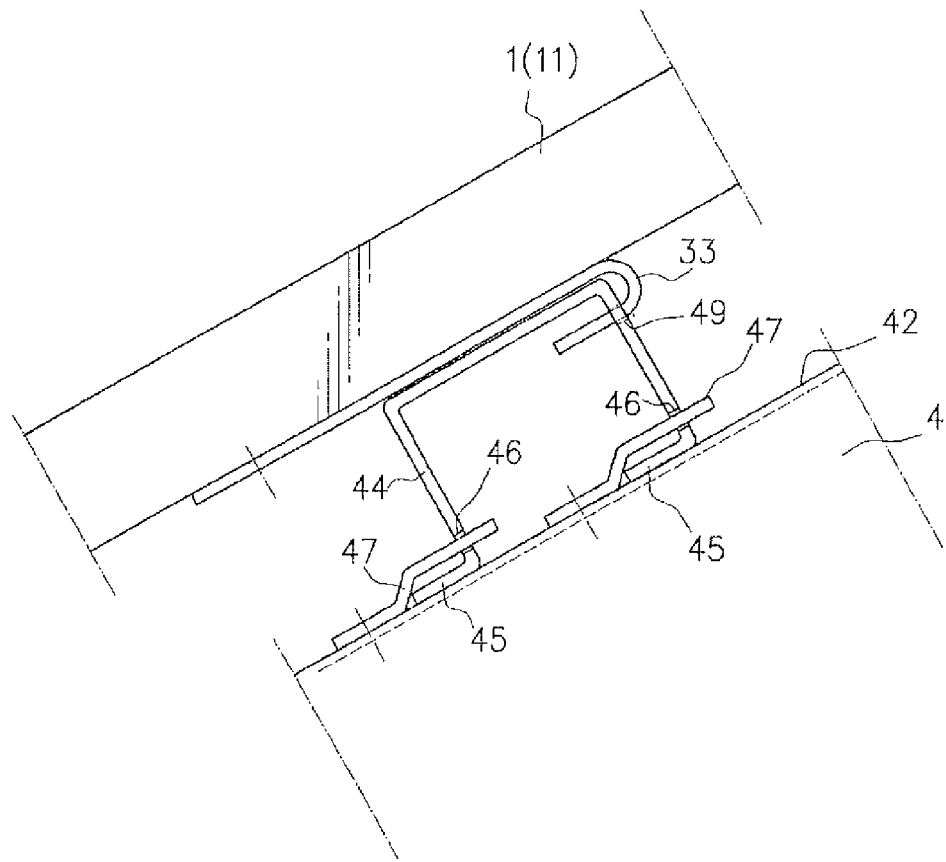
FIG. 4 is a side view illustrating relationship between a module support frame and a fixture.
Figure 5:
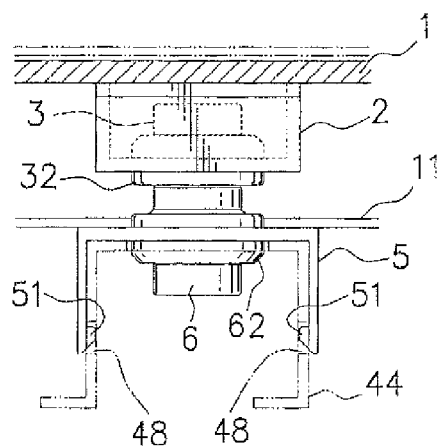
FIG. 5 is a vertically cross-sectional view illustrating a coupling state of connectors.
Figure 6:
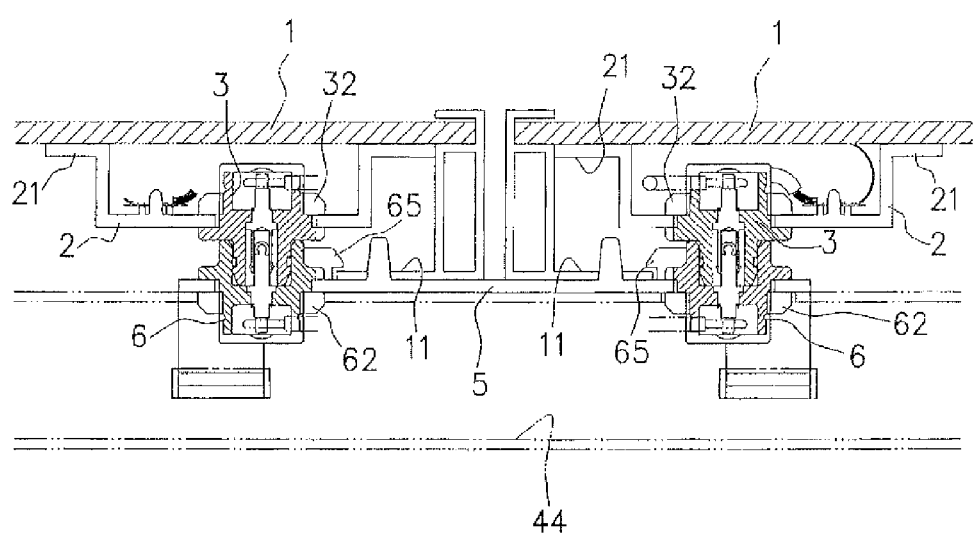
FIG. 6 is a side view illustrating a coupling state of connectors.
Figure 7:
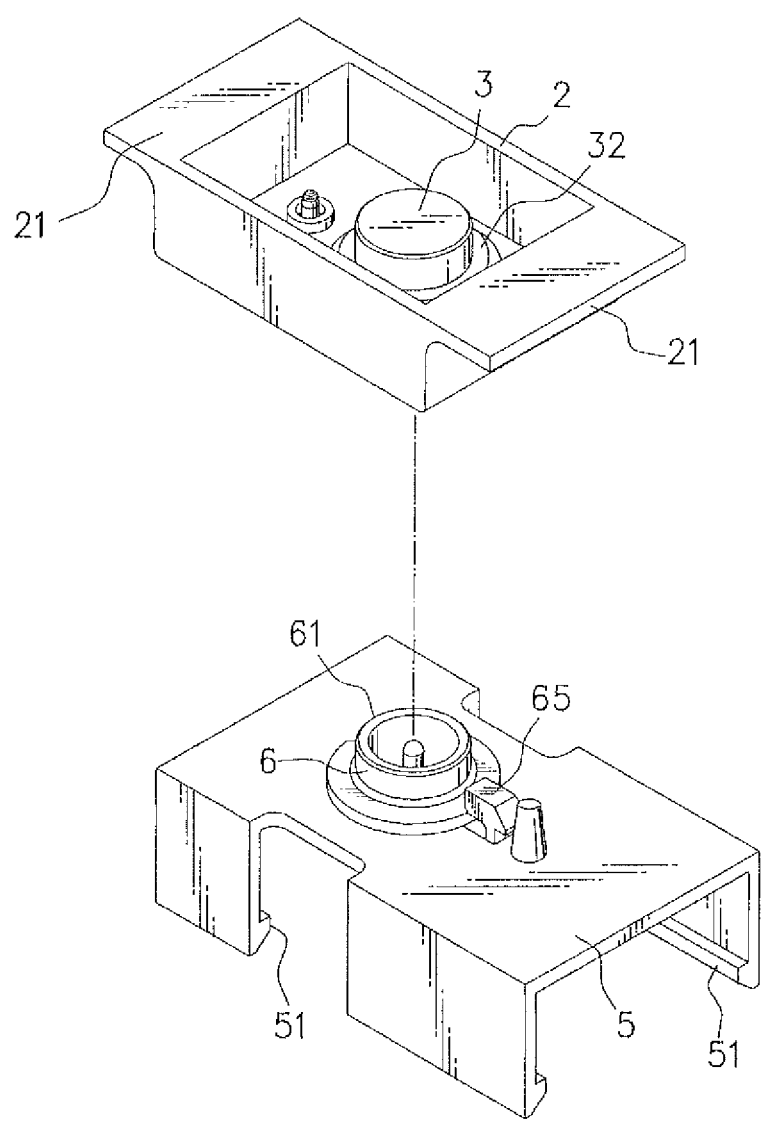
FIG. 7 is a perspective view illustrating relationship between a module side connector and a mount side connector.
Figure 8:
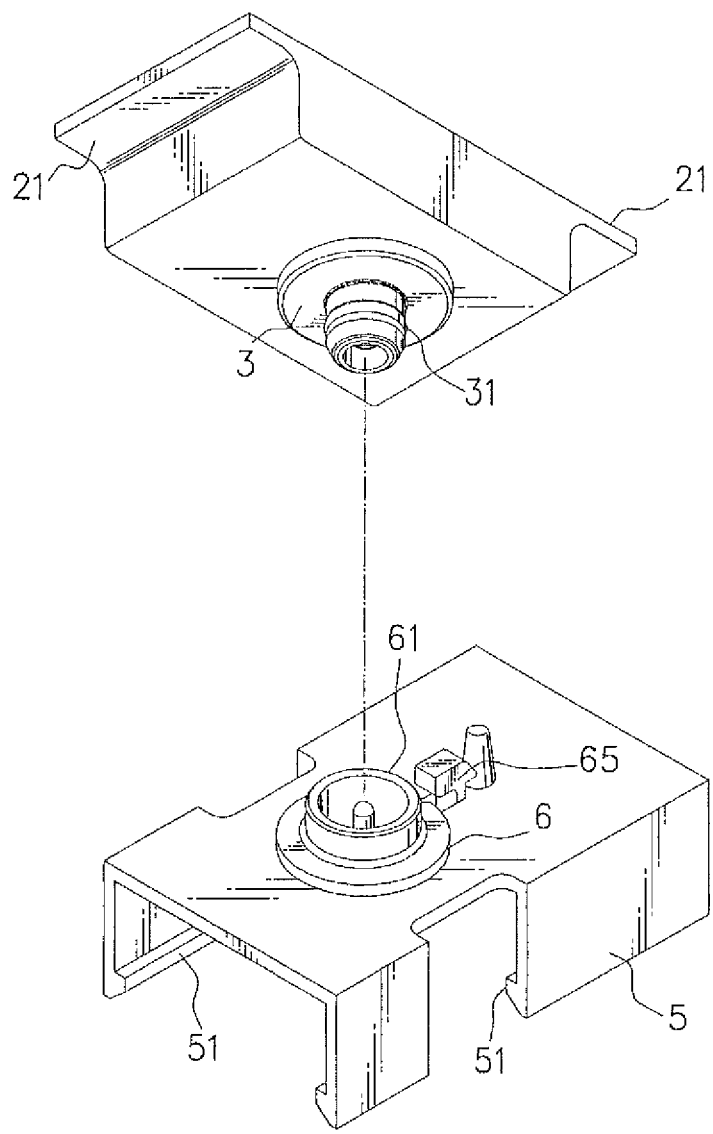
FIG. 8 is a perspective view also illustrating relationship between the module side connector and the mount side connector.

According to an example of the following drawings the present invention will be specifically described. The reference sign 1 shows a solar cell module, the reference sign 4 a mount supporting the solar cell module 1, and the mount supporting the solar cell module is provided with a module side connector 3 arranged on a lower face of the solar cell module 1, a mount side connector 6 arranged on an upper face of the mount 4 supporting the solar cell module 1, which the connectors 3, 6 are coupled to coinstantaneously connect an output of the solar cell module 1 and fix the solar cell module to the mount.

The solar cell module is formed such that between a front cover and a back cover the solar cell module, an interconnector, a filler are filled, the front cover being made of transparent panel of reinforced glass or hard synthetic resin, the back cover being made of laminated film, and a surrounding flexible frame 11 is arranged on an outer circumference, or in the present invention a surrounding flexible frame formed by a vertically lateral frames and a laterally vertical frames made of aluminum extrusion material.

The solar cell module is designed to supply power to the power conditioner via not-shown cable connected to the mount side connector 6 by connecting each modular side connector 3 to a plus output terminal and a minus output terminal back the solar cell module 1, and coupling the module side connector 3 to the mount side connector 6.

In the solar cell module 1 the module side connector 3 is arranged in two places at vertical or lateral ends of the solar cell module 1, in the present embodiment the fixture 33 is arranged at the solar cell module 1 or to the surrounding flexible frame 11 arranged at the solar cell module 1 in two places at vertical or lateral ends thereof. The module side connector 3 in the present embodiment is positioned at an end of the solar cell module 1, in the present embodiment positioned in-plane inside the laterally vertical frames of the surrounding flexible frame11, below the solar cell module 1, for example, in-plane downward position shifted upward by 20 to 30 cm from its lower end, and in two reverse places in laterally the same height, and the fixture 33 is positioned in two reverse places upward the laterally vertical frames of the flexible frame 11 of the solar cell module 1, and in-plane downward position also shifted downward by 20 to 30 cm from its upper end.

The module side connector 3 is arranged at the connector box 2 arranged on the lower face of the solar cell module 1 with the coupling part 31 projecting downward. The connector box 2 in the present embodiment is made of synthetic resin, and opens upwardly, and in a hollow part thereof the connector 3 is arranged. The connector 3 is circular-ring-shaped, has an electrode centrically arranged that can output by connecting an input terminal to the output terminal on the lower face of the solar cell module 1, is made of synthetic resin, has the coupling part 31 connected with the mount side connector 6, is male-shaped, and has the coupling part 31 project downwardly through a through hole in a bottom wall of the hollow part of the connector box 2. At this time the connector 3 has a female-type screw upside a body of an outer circumference of the connector 3, and using a fixing ring 32 having a male-type screw of an inner circumference arranged above the bottom wall of the hollow part of the connector box 2, is threaded into the male-type screw of the fixing ring 32, and has a flared portion under the body abut onto a circumferential edge of the through hole in the bottom wall of the hollow part of the connector box 2 and pinch the bottom wall by the fixing ring 32 and the flared portion. According to conventional method of filling silicon and isolating for example, after arranged at the connector 3, the connector box 2 is fixed to the solar cell module 1, for example, by bonding with adhesive a fixing piece 21 arranged flared at an upper edge of the connector box 2, and an upper edge between the fixing pieces 21 to a back face of the solar cell module 1.

The fixture 33 of the solar cell module 1 is made by configuration of a hook fixture, of which a hook is directed downward, and of which a fixture is screwed to the laterally vertical frames for example, thereby fixing the solar cell module.

Using metal bar material such as steal or aluminum extrusion material for example, the mount 4 is provided with a support post 41 height adjustable as necessary so as to slant and hold the solar cell module 1 southward on the ground or deck roof, a laterally or vertically installation member 42 held by the support post 41, and a reinforcement member 43 used for need, and is configured such that a top face thereof being slanted as self-supporting frame. The mount 4 of the present embodiment is made such that many even number of solar cell modules, for example, total four pieces with vertical two rows and lateral two columns are supported.

The mount 4 is provided with a pair of parallel module frames 44 every solar cell module 1, the one of which is for arranging the mount side connector 6, the other for fixing the solar cell module 1 or the flexible frame 11 installed therein, or in the present embodiment for fixing the fixture 33 arranged at the foregoing surrounding flexible frame. The module support frame 44 in the present embodiment slants and supports the foregoing four pieces of solar cell modules 1 in accordance with the mount 4 by arranging the foregoing self-supporting frame mount 4 laterally and horizontally relative to the lateral pair of vertically-slanted installation member 42. Also, the pair of parallel module support frames 44 is arranged vertically in a slant direction relative to the mount 4, the module support frame located above 44 is adapted for fixing the foregoing fixture, and the module support frame located below 44 for arranging the foregoing mount side connector.

The module support frame 44 is U-shaped, opens downward, is provided with a projection piece 45 which is directed in the same direction at a lower end of respective back and forth droop piece, in the present embodiment a projection piece oriented in a downward direction of the slant, is made of steal, and has a latch hole 46 at given intervals passed therethrough downside the respective droop piece. For example, using a pair of s-shaped fixtures 47 respective one end of which is fixed to the mount 4 as a fixing piece to, in the present embodiment, the foregoing installation member 42 by screw clamp for example, respective another end of which is, as a latch piece, inserted into the latch hole 46 of the module support frame 44, e.g., such as to be pressed, to be installed and fixed between lateral installation members 42. At this time, of the parallel pairs the module support frame 44 adapted for arranging the mount side connector has a latch hole 48 passed therethrough in two places at intervals centrically in respective length direction, and using the latch hole 48 the mount side connector 6 is installed. The module support frame 44 for a fixture has a hook receiving hole 49 similarly in two places at intervals centrically in respective length direction, and in the present embodiment the hook fixture is hooked, so as to fix the solar cell module 1.

The mount side connector 6 is arranged such that a coupling part 61 is projected upward from the connector box or the connector base arranged on the module support frame 44. In the present embodiment the mount side connector 6 is arranged on a ceiling wall of the synthetic-resin-made connector base 5 which is similarly U-shaped and opens downward, is circular-ring-like shaped having an electrode arranged at the center thereof, is made of synthetic resin having the coupling part 61 female-type shaped coupled to the module side connector 3. Furthermore, the mount side connector 6 has the coupling part 61 project upward from the through hole passing though the ceiling wall of the connector base, making it possible to couple with the foregoing module side connector 3. At this time the mount side connector 6 is arranged such that using a fixing ring 62 having a male-type screw in an inner circumference arranged under the ceiling wall of the connector base, a female-type screw under a body of an outer circumference of the mount side connector 6 is arranged at the fixing ring 62, a flared part upside the body is abutted on a circumferential edge of the through hole of the ceiling wall of the base so as to nip the ceiling wall with the foregoing fixing ring 62 and the flared part.

The connector base 5 arranged at the mount side connector 6 is provided with an opposed latch projection 51 at a lower end of the respect back and forth droop pieces, and latching the latch projection 51 with the latch hole 48 passing through the droop piece of the module support frame 44 allows for fixing the module support frame 44. At this time, the module support frame 44 has on its top face a through hole to receive the mount side connector, a downside of the body of the connector 6 projecting downwardly from the ceiling wall of the connector base is arranged receivable between the droop pieces via the through hole.

The fixing ring 62 nipping the mount side connector 6 between the connector base 5 and the fixing ring 62 is provided intermediately in the circumferential direction with a cross-sectionally T-shaped snap-in latch piece 65 integrally, which projects upwardly via a notch of the connector base 5, namely, above the ceiling wall of the connector base 5. The snap-in latch piece 65 has an outside projection piece of its top end slanted, and thus pressing the slanted face allows the fixing ring 62 to move in inward or outward direction.

The solar cell module 1 and the mount 4 formed as such, have the module side and the mount side connectors 3, 6 arranged in two places of vertical or lateral ends of the solar cell module 1, and in corresponding two places in the length direction of the module side support frame 44, respectively, and have the fixtures 33 arranged similarly in two places of vertical or lateral ends of the solar cell module 1, and in corresponding two places in the length direction of the module side support frame 44, thereby supporting in four places the mount of the solar cell module 1. In the mount 4, in the present embodiment adapted for four pieces of the solar cell module 1, the foregoing male-type coupling part 31 of the module side connector 3 of the solar cell module 1 is coupled to the foregoing female-type coupling part 61 in total two places of lateral end and intermediate portion of the mount connector 6 of the module support frame 44 located below, and the fixture 33 arranged in two places of lateral ends, especially, the fixture 33 arranged at laterally vertical frame in the flexible frame 11, in the present embodiment the foregoing hook fixture is each latched in the hook receiving hook 49 in total two places of lateral end and intermediate portion of the module support frame 44 arranged above, thereby performing fixing.

At this time, since the solar cell module 1 in the present embodiment is fixed such that the hook fixture of the forgoing fixture 33 is latched in the hook receiving hole 49, particularly by making the hook receiving hole 49 a loose through hole, the hook fixture is latched rotatively, thus performing its fixing, the solar cell module 1 is fixed to the pair of parallel module support frames 44 of the mount 4 such that the fixture 33, namely, the hook fixture is latched into the hook receiving hole 49 of the module support frame 44 located above while rotating the hook fixture or is rotated after latched, fixing the fixture 33 of the solar cell module 1 located above and the module support frame 44 located above. Pressing downward the solar cell module 1 rotatively around a latch position of the fixture 33 allows the module side connector 3 to be coupled with the mount side connector 6 of the module support frame 44 located below, making possible coinstantaneous connection of the output and fixing to the mount. Furthermore, in the present embodiment, since the cross-sectionally T-shaped snap-in latch piece 65 is integrally arranged at the fixing ring 62 of the mount side connector 6 via a notch of the connector base 5, pressing downward the solar cell module 1 allows the flexible frame 11, especially a tip of the projection piece located below disposed in the vertical frame, to contact and pass through outside of the projection piece the top end of which becomes slanted face of the snap-in latch piece 65, and thereby projection piece located below of the vertical frame is latched with the snap-in latch piece 65, making possible securing of fixing by a single action of downward press the solar cell module to the mount 4. Therefore, it is made possible to readily install the solar cell module 1 to the mount 4, ensuring workability as much as possible.

While illustrated embodiments are described above, various configurations but within the subject matter of the invention, can be made such as specific form, structure, material, these relationship, and addition to these for solar cell module, module side connector, mount, mount side connector, module support frame used necessarily, surrounding flexible frame, fixture, connector box, connector base, hook fixture, hook receiving hole, snap-in latch means, or the like, including: increase of the support number of the solar cell module such as being disposed in vertical three rows and in lateral four columns; arrangement of the snap-in latch means so that one is snap-in latched to the other of the module side connector and the mount side connector; arrangement of module support frame located below for fixing the fixture, and that located above for arranging the mount side connector, and arrangement of the fixture and the module side connector in the solar cell module, corresponding to the above arrangement; increase of the number of support places of the solar cell module using the dummy connector and the fixture if necessary; and arrangement of the mount side connector to the connector box arranged on the top face of the module support frame.

REFERENCE SIGNS LIST 1 solar cell module
11 surrounding flexible frame
2 connector box
21 fixing piece
3 module side connector
31 coupling part
32 fixing ring
33 fixture
4 mount
41 post
42 installation member
43 reinforcement member
44 module support frame
45 projecting piece
46 latch hole
47 fixture
48 latch hole
49 hook receiving hole
5 connector base
51 latch projection
6 mount side connector
61 coupling part
62 fixing ring
65 snap-in latch piece

The invention claimed is:

1. A mount support structure for a solar cell module, comprising:
a module side connector arranged on a lower face of the solar cell module and connected to a plus output terminal and a minus output terminal;
a mount side connector arranged on an upper face of a mount supporting the solar cell module, wherein the module side connector and the mount side connector are coupled so as to coinstantaneously connect an output of the solar cell module and fix the solar cell module to the mount; a pair of parallel module support frames disposed on the mount every solar cell module, wherein one of the pair of module support frames is adapted for arranging the mount side connector, and another of the pair of module support frames is adapted for fixing a fixture arranged at the solar cell module or a surrounding flexible frame disposed on the solar cell module, wherein the module side connector is, with a coupling part projecting downwardly, arranged at a connector box arranged on a lower face of the solar cell module, and wherein the mount side connector is, with the coupling part projecting upwardly, arranged at the connector box or a connector base arranged on an upper face of the module support frame.

2. The mount support structure as claimed in claim 1, wherein the module side connector and the mount side connector are arranged at two places of vertical or lateral ends of the solar cell module, and in corresponding two places in a lengthwise direction of the one of the pair of module support frames, and the fixture is fixed in two places of vertical or lateral ends of the solar cell module, and in corresponding two places in a lengthwise direction of the another of the pair of module support frames, thereby supporting the solar cell module by the mount in four places.

3. The mount support structure as claimed in claim 2, wherein the solar cell module is fixed to the mount by coupling the connectors to each other, or by latching of snap-in latching part located between the connector and the solar cell module or the surrounding flexible frame arranged at the solar cell module are latched.

4. The mount support structure as claimed in claim 1, wherein the pair of parallel module support frames is arranged on the mount in a vertically-slanted direction, and wherein the module support frame located above is adapted for fixing the fixture, and the module support frame located below is adapted for arranging the connector.

5. The mount support structure as claimed in claim 4, wherein the solar cell module is fixed to the mount by coupling the connectors to each other, or by latching of snap-in latching part located between the connector and the solar cell module or the surrounding flexible frame arranged at the solar cell module are latched.

6. The mount support structure as claimed in claim 1, wherein the solar cell module is fixed by a fixture in such a fashion that a hook fixture arranged at the solar cell module is rotatively latched in a hook receiving hole arranged at the module support frame.

7. The mount support structure as claimed in claim 6, wherein the solar cell module is fixed to the mount by coupling the connectors to each other, or by latching of snap-in latching part located between the connector and the solar cell module or the surrounding flexible frame arranged at the solar cell module are latched.

8. The mount support structure as claimed in claim 1, wherein the solar cell module is fixed to the mount by coupling the connectors to each other, or by latching of snap-in latching part located between the connector and the solar cell module or the surrounding flexible frame arranged at the solar cell module are latched.

9. The mount support structure as claimed in claim 1, wherein the solar cell module is fixed to the mount by coupling the connectors to each other, or by latching of snap-in latching part located between the connector and the solar cell module or the surrounding flexible frame arranged at the solar cell module are latched.

10. The mount support structure as claimed in claim 1, wherein the solar cell module is fixed to the mount by coupling the connectors to each other, or by latching of snap-in latching part located between the connector and the solar cell module or the surrounding flexible frame arranged at the solar cell module are latched.

\* \* \* \* \*